(12) United States Patent
Chen et al.

(10) Patent No.: US 6,864,963 B2
(45) Date of Patent: Mar. 8, 2005

(54) POSITION MEASURING SYSTEM WITH MULTIPLE BAR MIRRORS

(75) Inventors: Hwei-Chi Chen, Chang-Hua Hsien (TW); Chin-Lung Ting, Tainan (TW)

(73) Assignee: Chi Mei Optoelectronics Corporation, Tainan (TW)

( * ) Notice: Subject to any disclaimer, the term of this patent is extended or adjusted under 35 U.S.C. 154(b) by 0 days.

(21) Appl. No.: 10/249,105

(22) Filed: Mar. 17, 2003

(65) Prior Publication Data

US 2003/0179358 A1 Sep. 25, 2003

(30) Foreign Application Priority Data

Mar. 19, 2002 (TW) ........................................ 91105239 A
Mar. 12, 2003 (TW) ........................................ 92105405 A

(51) Int. Cl.[7] ........................ G03B 27/62; G03B 27/58; G03B 27/42; G01B 11/02
(52) U.S. Cl. .............................. 355/75; 355/72; 355/53; 356/500
(58) Field of Search .............................. 355/75, 53, 72; 356/399, 400, 401, 500, 498; 382/145; 250/548

(56) References Cited

U.S. PATENT DOCUMENTS 6,323,936 B1   11/2001  Charbonnier et al.
2003/0142321 A1 *  7/2003  Hattori ....................... 356/500

* cited by examiner

Primary Examiner—Peter B. Kim
(74) Attorney, Agent, or Firm—Winston Hsu

(57) ABSTRACT

A position measuring system is utilized for measuring a position of a stage positioned on a pedestal. As the stage is moved along a predetermined direction, a controlling device utilizes a first measuring apparatus to measure a moving direction of the stage during the first period. Then, the controlling device uses the moving direction measured by the first measuring apparatus to adjust the moving direction measured by the second measuring apparatus during the overlapping period of the first period and a second period. After adjusting the second measuring apparatus, the controlling device utilizes the second measuring apparatus to measure the moving direction of the stage during the second period.

18 Claims, 21 Drawing Sheets

POSITION MEASURING SYSTEM WITH MULTIPLE BAR MIRRORS

BACKGROUND OF THE INVENTION

1. Field of the Invention

The present invention relates to a position measuring system, and more particularly, to a position measuring system with multiple bar mirrors for measuring a position of a stage and a mask in an exposure apparatus.

2. Description of the Prior Art

When manufacturing a liquid crystal display (LCD) panel, a photolithographic process and an etching process are used to define all kinds of electronic elements and optical elements (such as a color filter). Now, requirements for large-sized LCD panels are increased and a scanning exposure system is suitable for exposing large-sized substrates, so that the scanning exposure system is currently widely used in the photolithographic process.

Please refer to FIG. 10. FIG. 10 is a schematic diagram of a prior art scanning exposure system. As shown in FIG. 10, an exposure system 100 comprises a light source 102, a mask 104 positioned under the light source 102, and an optical system 106 positioned under the mask 104. Additionally, the mask 104 comprises a plurality of slits forming a predetermined pattern. The optical system 106 comprises a trapezoidal mirror 106a, a concave mirror 106b, and a convex mirror 106c located between the trapezoidal mirror 106a and the concave mirror 106b. The exposure system 100 further comprises a pedestal 108, a stage 110 positioned on the pedestal 108 in a movable way, and a substrate 112 positioned on the stage 110. The stage 110 is used to carry and move the substrate 112. A driving device (such as a linear motor) is used to control the stage 110 to move on the pedestal 108 in a magnetic levitation manner or an air-floating manner. Furthermore, the driving device also controls a moving direction of the stage 110 on the pedestal 108. The following description takes measuring a position of the stage 110 as an example.

For making the stage 110 move along a predetermined direction, a position measuring system is required to measure a moving direction of the stage 110. The position measuring system further transmits the measuring results to a control device, which can adjust the moving direction of the stage 110 adequately. Accordingly, the stage 110 is moved along the predetermined direction. Please refer to FIG. 11. FIG. 11 is a schematic diagram of a prior art position measuring system. As shown in FIG. 11, a prior art position measuring system comprises a stage 110, reflective mirrors 114, 116 disposed on the stage 110, laser interferometers 118a, 118b mounted beside the reflective mirror 114, laser interferometers 120a, 120b mounted beside the reflective mirror 116, and a control device 122. The laser interferometers 118a, 118b are used to measure a position of the stage 110 in the Y-axis direction, and the laser interferometers 120a, 120b are used to measure a position of the stage 110 in the X-axis direction.

Because a requirement of a large-sized liquid crystal display panel increases rapidly, it is necessary to manufacture a large-sized substrate 112. In the mean time, the size of the stage 110 in the exposure apparatus is increased due to the large-sized substrate 112. In order to precisely control the moving direction of the large-sized stage 110, lengths of the reflective mirrors 114, 116 are therefore prolonged. However, it is hard to manufacture a large-sized reflective mirror of a high quality through use of the present grinding technology. As a result, it is necessary to build a position measuring system with small-sized reflective mirrors capable of measuring a moving direction of a large-sized stage.

SUMMARY OF INVENTION

It is therefore a objective of the claimed invention to provide a position measuring system with multiple bar mirrors for solving the above-mentioned problems.

According to the claimed invention, a position measuring system with multiple bar mirrors is provided. The position measuring, system comprises a pedestal, a stage mounted on the pedestal in a movable way, a driving device for controlling a moving direction of the stage on the pedestal, a first measuring apparatus having a first bar mirror and at least two first position measuring device, with the first bar mirror and both of the first position measuring devices being disposed on the pedestal and the stage respectively, a second measuring apparatus having a second bar mirror and at least two second position measuring devices, the second bar mirror and both of the second position measuring device being disposed on the pedestal and the stage respectively, and a controlling device for controlling the position measuring system. When the stage is moved along a specific direction, the controlling device utilizes the fist measuring apparatus and the second measuring apparatus for measuring the position of the stag during a first period and during a second period respectively, and utilizes the driving device for controlling; the moving direction of the stage on the pedestal, in which a latter part of the first period overlaps with a former part of the second period, and the controlling device uses the first measuring apparatus to measure the position of the stage during the first period. Then the controlling device uses the position measured by the first measuring apparatus to adjust the position measured by the second measuring apparatus during an overlapping period of the first period and the second period, and after adjusting the second measuring apparatus, the controlling device utilizes the second measuring apparatus for measuring the position of the stage during the second period.

It is an advantage over the prior art that the claimed invention utilizes a composition of a plurality of bar mirrors and position measuring device for measuring a position of the stage. Additionally, the amounts of bar mirrors can be increased or decreased according to the size of the stage, and the position of the stage is measured by adjusting the position measuring devices with one another. As a result, the claimed invention is suitable for a substrate of any kinds of sizes. As the substrate becomes larger, the length of the bar mirrors are unnecessarily prolonged, thus preventing difficulties in making large-sized bar mirror.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
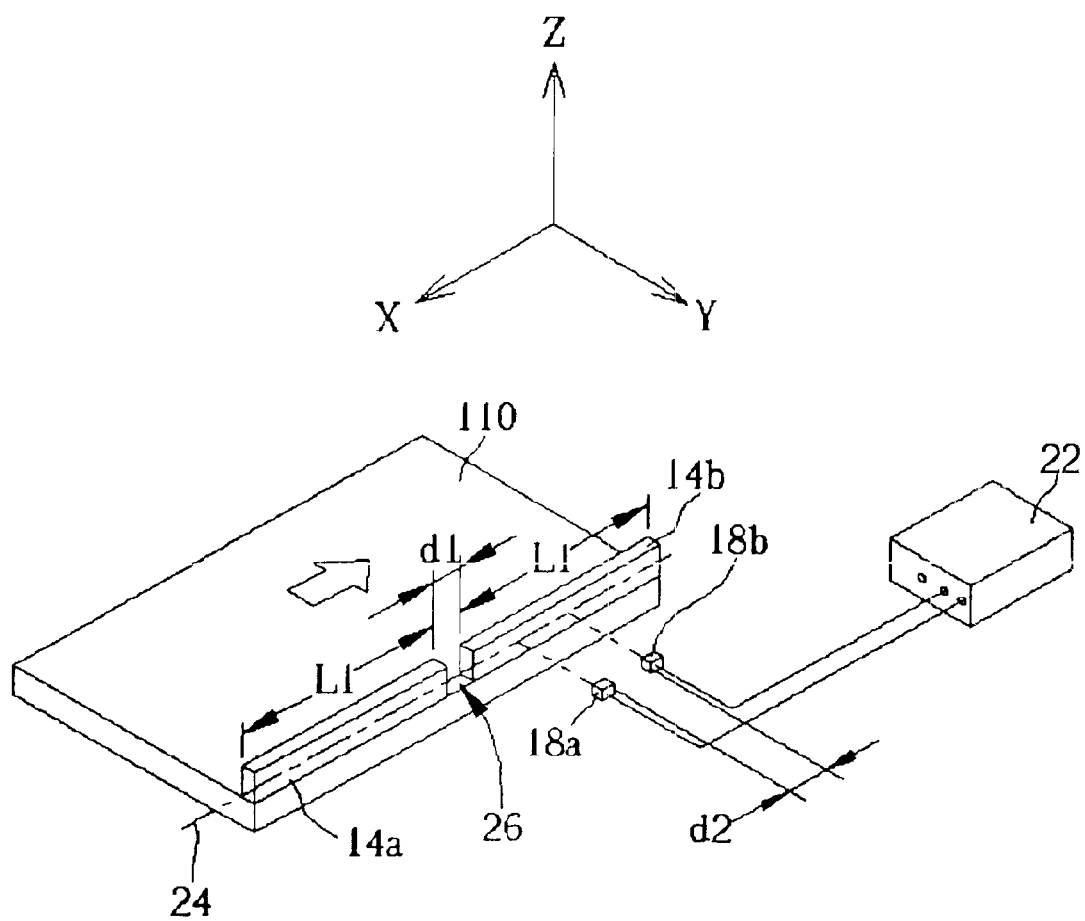
FIG. 1 is a schematic diagram of a position measuring system according to a first embodiment of the present invention.

Please refer to FIG. 1. FIG. 1 is a schematic diagram of a position measuring system according to a first embodiment of the present invention. As shown in FIG. 1, a position measuring system comprises the stage 110, bar mirrors 14a and 14b disposed on one side of the stage 110, position measuring devices 18a and 18b disposed on the pedestal beside the bar mirror 14a, and a control device 22. In addition, the position measuring system further comprises a driving device (such as a linear motor) for moving the stage 110 along a pre-determined direction (ex. X-axis). The position measuring devices 18a and 18b are positioned on a horizontal line 24. The bar mirrors 14a and 14b are positioned at the same horizontal line. Moreover, a width of a gap 26 between the bar mirrors 14a and 14b is $d_1$. A distance between two adjacent position measuring devices is $d_2$, which is larger than $d_1$. Additionally, a length $L_1$ of each of the bar mirrors 14a and 14b has to be larger than the distance $d_2$.

Figure 2A:
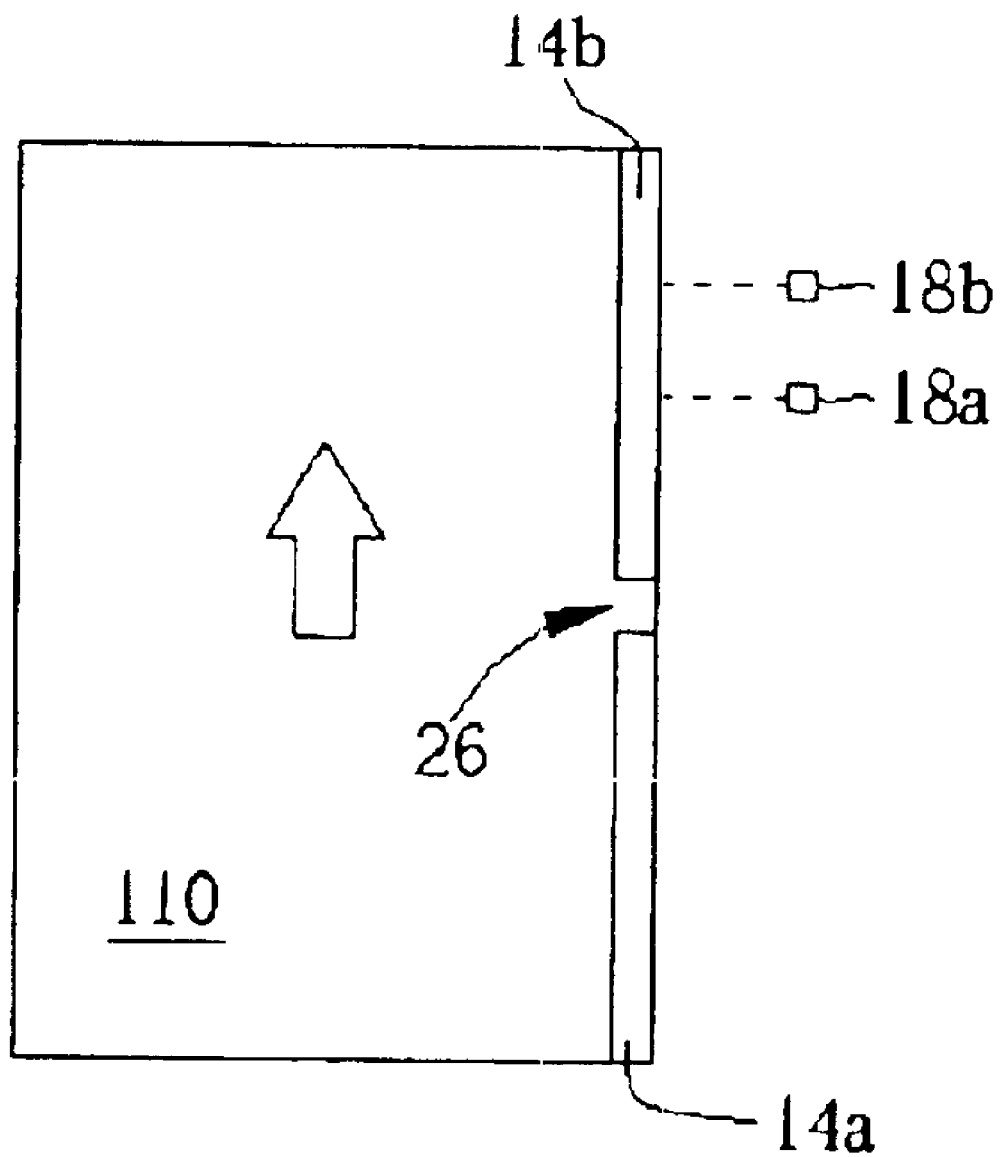
FIG. 2(A) to FIG. 2(D) are schematic diagrams illustrating measuring a position of the stage as the stage is moved along the X-axis direction.

Please refer to FIG. 2(A) to FIG. 2(D). FIG. 2(A) to FIG. 2(D) are schematic diagrams illustrating measuring a position of the stage as the stage is moved along the X-axis direction. As shown in FIG. 2(A), when the stage 110 is moved along the X-axis direction, the position measuring devices 18a and 18b project laser beams to the bar mirror 14b. Then, the laser beams are reflected by the bar mirror 14b, and are received by the position measuring devices 18a and 18b. After that, a signal processing system processes the projected laser beams and the reflected laser beams to calculate a distance between the bar mirror 14b and position measuring devices 18a, 18b, and therefore, to obtain a position of the stage 110 in the Y-axis direction. Thereafter, based on the position of the stage 110 calculated by the signal processing system, the control device 22 utilizes the driving device to control the moving direction of the stage 110.

Figure 2B:
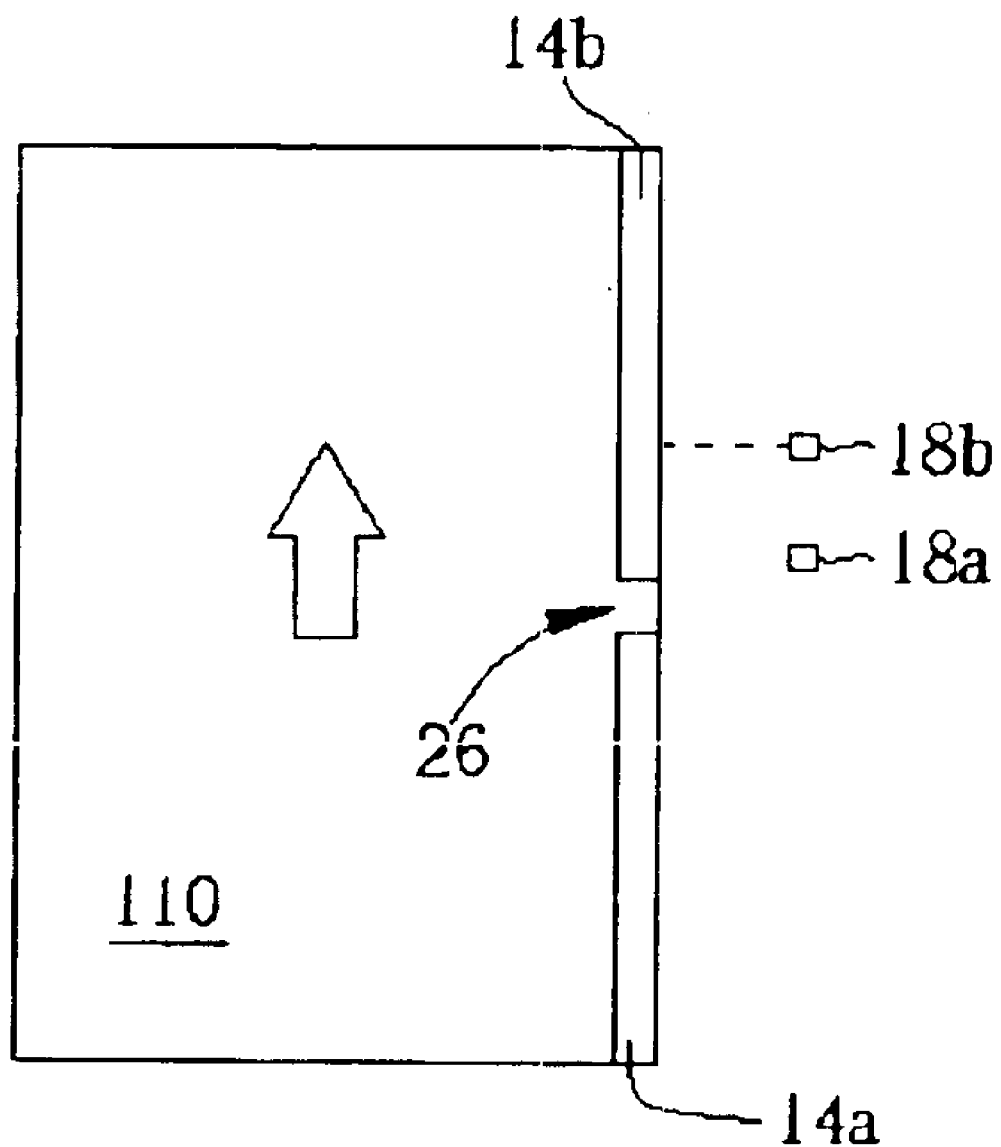
Figure 2C:
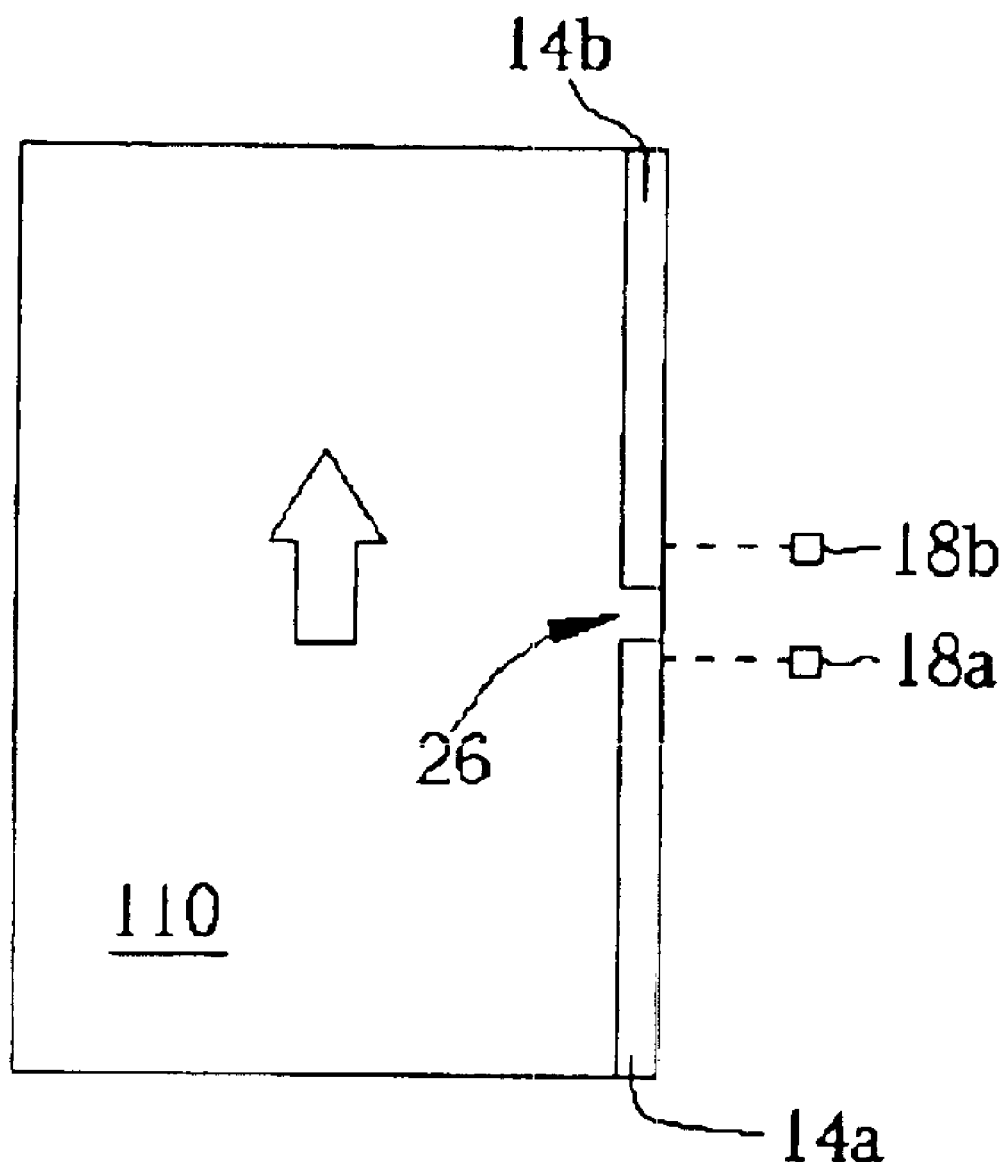

As shown in FIG. 2(B), the stage 110 is continuously moved along the X-axis direction and when the position measuring devices 18a is about to pass by the gap 26, the controlling device 22 stops utilizing the position measuring device 18a for measuring the position of the stage 110. As shown in FIG. 2(C), after the position measuring device 18a has passed the gap 26 completely, the position measuring device 18a starts again to measure a distance between the bar mirror 14a and the position measuring device 18a. Furthermore, the controlling device 22 will utilize the data measured from the position measuring device 18a, 18b to calculate a relationship between a position of the bar mirror 14a and a distance between the bar mirror 14a and the position measuring device 18a. Then, the controlling device 22 compare the data measured by the position measuring device 18a with the above relationship, for determining whether the stage 110 is moved along a correct direction or not. That is to say, the controlling device 22 uses the position measured by the position measuring devices 18b to adjust the position measured by the position measuring device 18a. After adjusting the position measuring device 18a, the controlling device 22 continues to utilize the bar mirrors 14a, 14b and the position measuring devices 18a and 18b for measuring the position of the stage 110. Noticeably, the position measuring system of the present invention provides two position measuring devices 18a and 18b, which can be adjusted by each other. Therefore, even though the bar mirror 14a is not aligned with the bar mirror 14b, the moving direction of the stage 110 still can be precisely monitored and controlled.

Figure 2D:
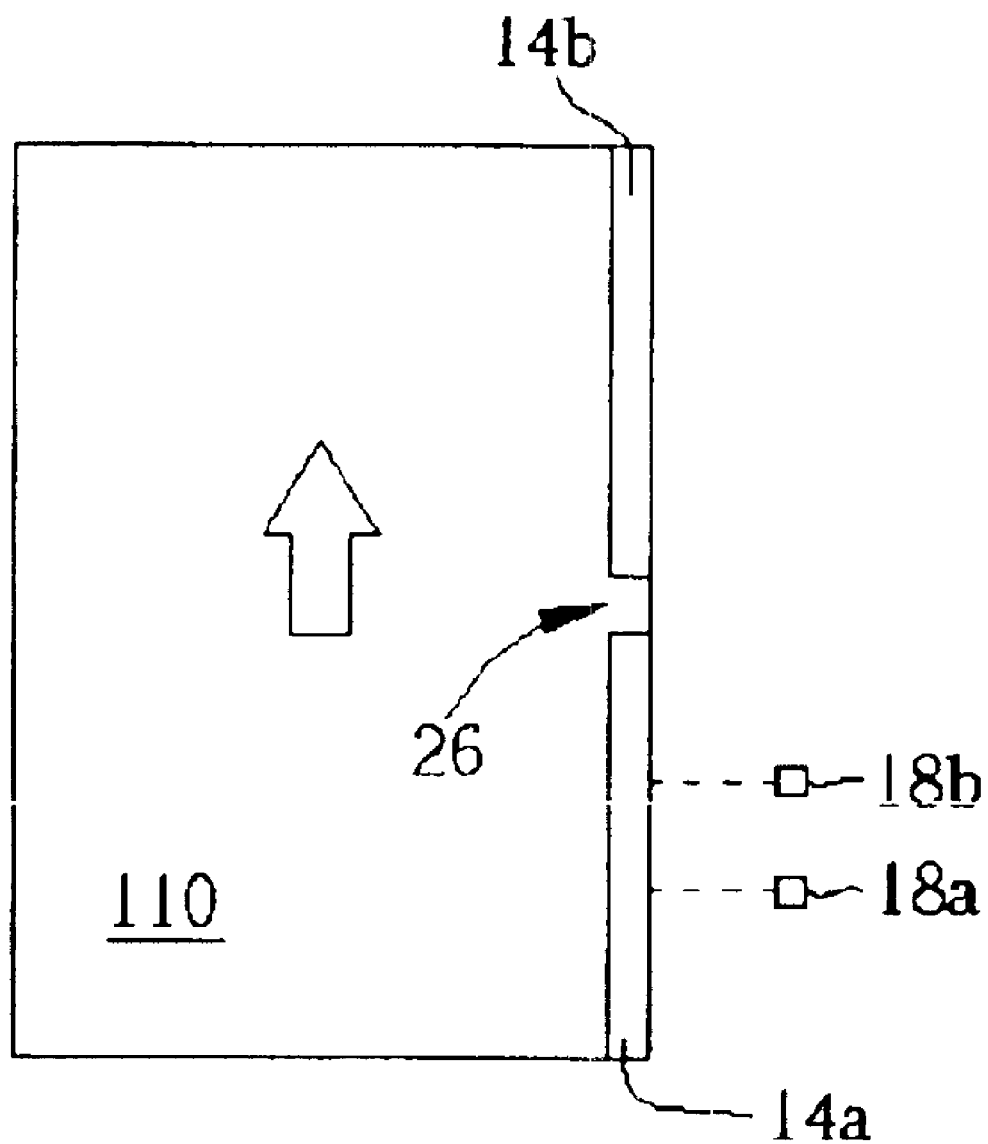

Simultaneously, when the position measuring devices 18b is about to pass by the gap 26, the controlling device 22 stops utilizing the position measuring device 18b for measuring the position of the stage 110. After the position measuring device 18b has passed the gap 26 completely, the controlling device 22 uses the position measured by the position measuring devices 18a to adjust the position measured by the position measuring device 18b. As shown in FIG. 2(D), after the position measuring device 18a and 18b have passed the gap 26 completely, the controlling device 22 continues to utilize the bar mirrors 14a and the position measuring devices 18a and 18b for measuring the position of the stage 110.

Figure 3:
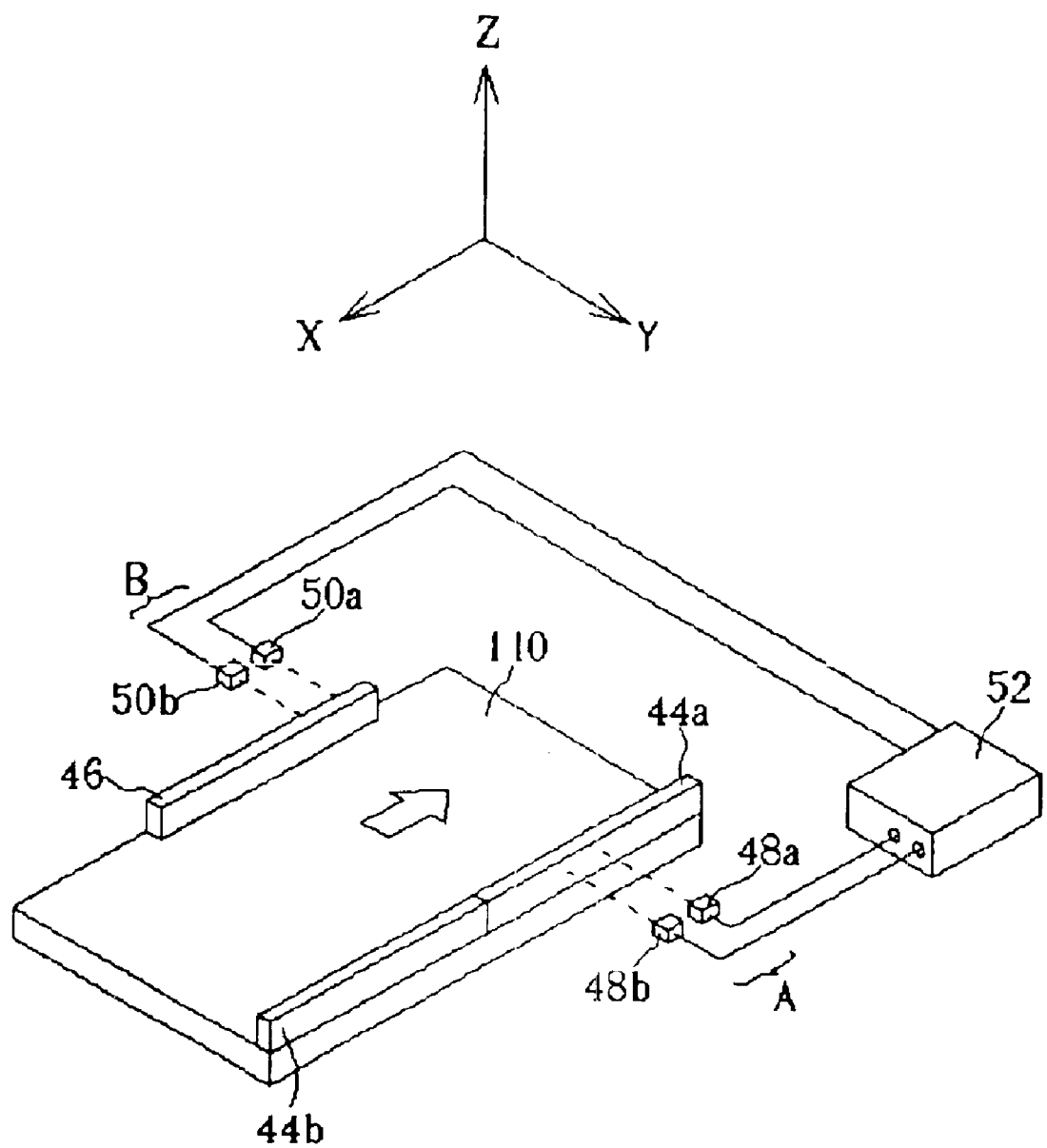
FIG. 3 is a schematic diagram of a position measuring system according to a second embodiment of the present invention.

Please refer to FIG. 3. FIG. 3 is a schematic diagram of a position measuring system according to a second embodiment of the present invention. As shown in FIG. 3, a position measuring system comprises the stage 110, two adjacent bar mirrors 44a and 44b positioned on one side of the stage 110, a bar mirror 46 positioned on the other side of the stage 110, position measuring devices 48a and 48b disposed on the pedestal beside the bar mirror 44a, position measuring devices 50a and 50b disposed on the pedestal beside the bar mirror 46, and a control device 52. The control device 52 controls the position measuring system, which further comprises a driving device (such as a linear motor) for controlling a moving direction of the stage 110 on the pedestal. In addition, the position measuring devices, described in the following description, are referred to as laser interferometers.

Figure 4A:
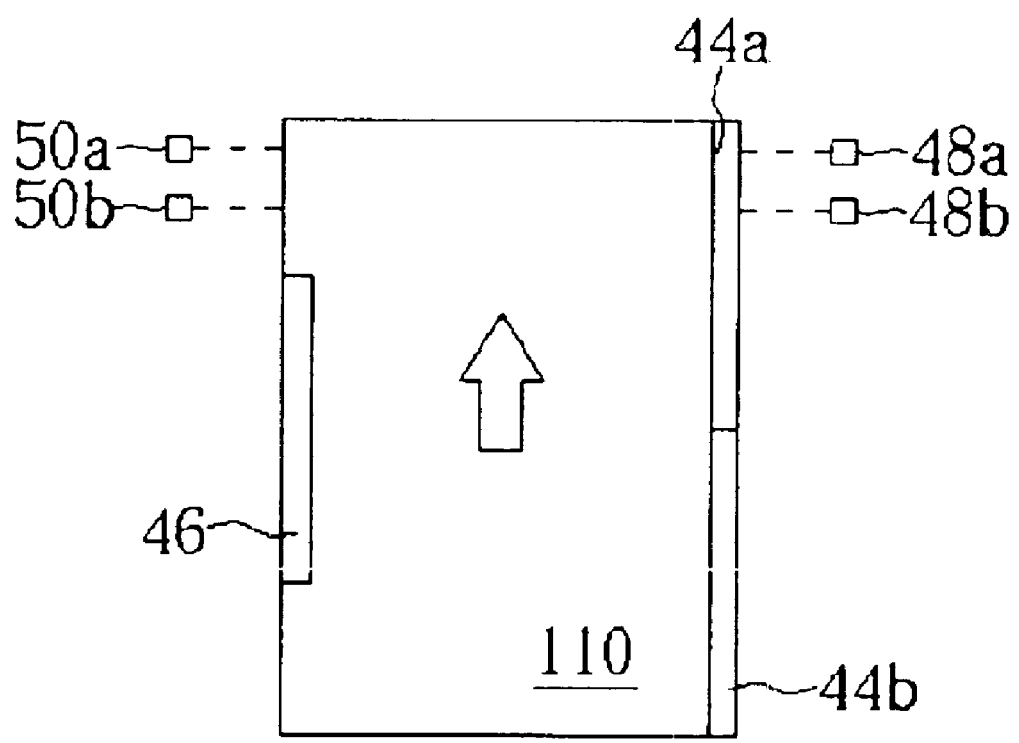
FIG. 4(A) to FIG. 4(C) are schematic diagrams illustrating measuring a position of the stage as the stage is moved along the X-axis direction.
Figure 4B:
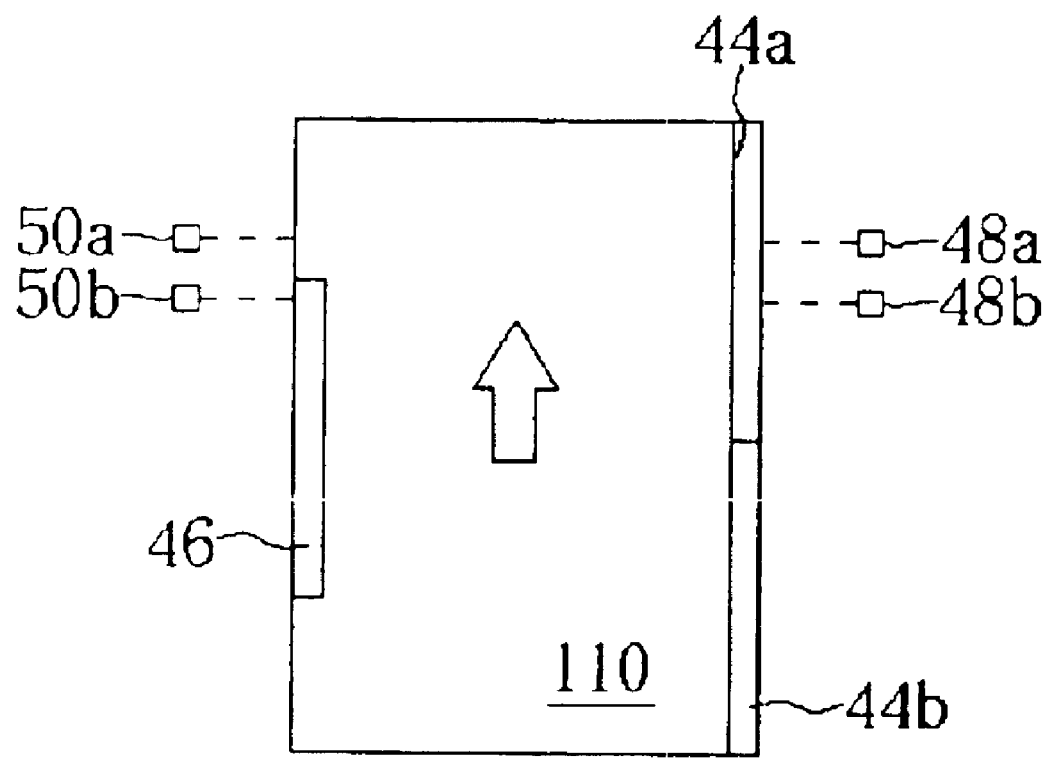
Figure 4C:
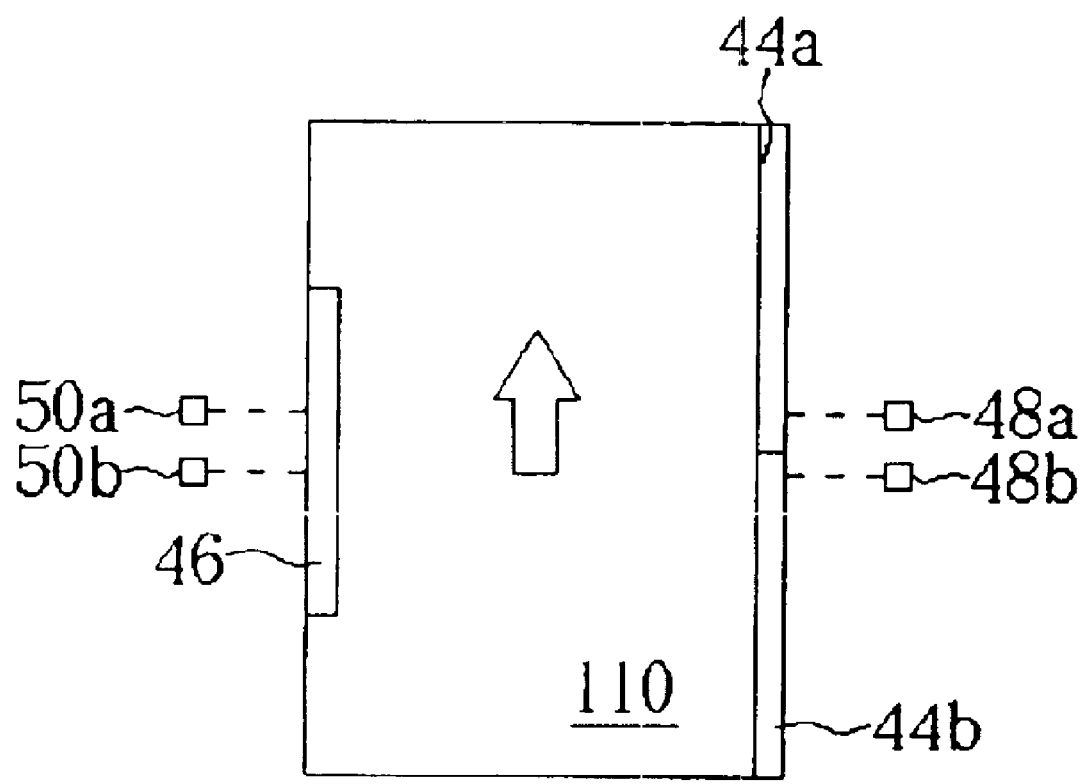

Please refer to FIG. 4(A) to FIG. 4(C). FIG. 4(A) to FIG. 4(C) are schematic diagrams illustrating measuring a position of the stage as the stage is moved along the X-axis direction. As shown in FIG. 4(A), when the stage 110 is moved along the X-axis direction, the position measuring devices 48a and 48b project laser beams to the bar mirror 44a. Then, the laser beams are reflected by the bar mirror 44a, and are received by the position measuring devices 48a and 48b. After that, a signal processing system processes the projected laser beams and the reflected laser beams to obtain a position of the stage 110 in the Y-axis direction. Thereafter, according the position of the stage 110 calculated by the signal processing system, the control device 52 utilizes the driving device to control the moving direction of the stage 110. Furthermore, the position measuring devices 48a and 48b can adjust themselves with each other, thus preventing the stage 110 deviating from its predetermined moving direction due to rotation.

As shown in FIG. 4(B), the stage 110 is continuously moved along the X-axis direction, and when the position measuring devices 50a, 50b pass by the bar mirror 46, the position measuring devices 50a and 50b begin to measure the position of the stage 110 in the Y-axis direction. However, the results measured by the position measuring devices 50a and 50b have not been adjusted; so that the control device 52 utilizes the results measured by the position measuring devices 48a, 48b to adjust the results measured by the position measuring devices 50a, 50b. After adjusting the position measuring devices 50a and 50b, the control device 52 uses the position measuring devices 50a and 50b to measure the position of the stage 110. According to the position measured by the position measuring devices 50a and 50b, the control device 52 can use the driving device to control the moving direction of the stage 110.

As shown in FIG. 4(C), the stage 110 is continuously moved along the X-axis direction and when the position measuring devices 48a, 48b pass by the bar mirror 44b, the position measuring devices 48a and 48b start to measure the position of the stage 110 in the Y-axis direction. However, the results measured by the position measuring devices 48a and 48b have not been adjusted, so that the control device 52 utilizes the results measured by the position measuring devices 50a, 50b to adjust the results measured by the position measuring devices 48a, 48b. After adjusting the position measuring devices 48a and 48b, the control device 52 is capable of using the position measuring devices 48a and 48b to measure the position of the stage 110. Based on the position measured by the position measuring devices 48a and 48b, the control device 52 can drive the driving device to control the moving direction of the stage 110.

Figure 5:
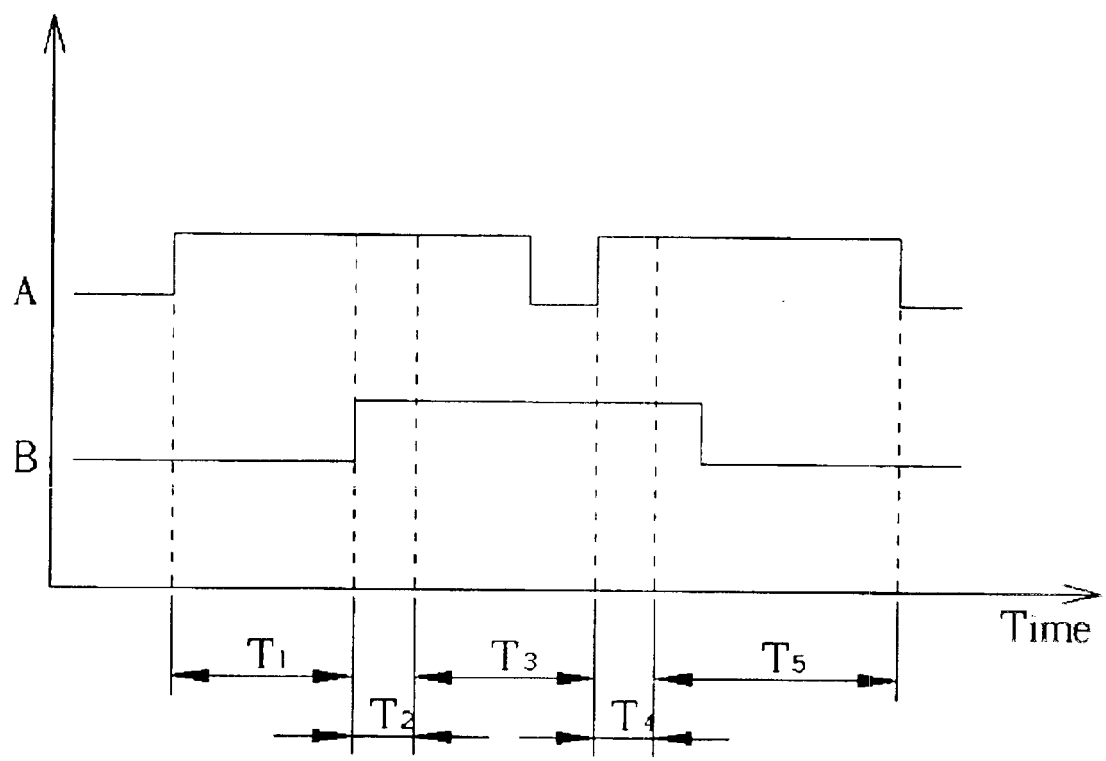
FIG. 5 is a time sequence diagram of position measuring devices.

Please refer to FIG. 5. FIG. 5 is a time sequence diagram of the position measuring devices 48a, 48b, 50a, and 50b. "A" represents the position measuring devices 48a and 48b, and "B" stands for the position measuring devices 50a and 50b. As shown in FIG. 5 and FIG. 4(A), when the stage 110 is moved along the direction pointed by the arrow, the position measuring devices 48a and 48b firstly pass by the bar mirror 44a, and they are used to measure the position of the stage 110 during $T_1$ period. Then, as shown in FIG. 5 and FIG. 4(B), the position measuring devices 50a and 50b pass by the bar mirror 46, and the control device 52 uses the position measured by the position measuring devices 48a, 48b to adjust the position measured by the position measuring devices 50a, 50b during $T_2$ period. After adjusting the position measuring devices 50a and 50b, the control device 52 uses the position measuring devices 50a and 50b to measure the position of the stage 110 during $T_3$ period. Then, as shown in FIG. 5 and FIG. 4(C), the position measuring devices 48a and 48b pass by the bar mirror 44b, and the control device 52 uses the position measured by the position measuring devices 50a and 50b to adjust the position measured by the position measuring devices 48a and 48b during $T_4$ period. After adjusting the position measuring devices 48a and 48b, the control device 52 uses the position measuring devices 48a and 48b to measure the position of the stage 110 during $T_5$ period. The present invention repeats the above-mentioned procedures for measuring the position of the large-sized stage 110.

Furthermore, in the first embodiment, the amounts of the bar mirrors can be increased or decreased according to the size of the stage 110. As long as N bar mirrors are disposed on one side of the stage 110 and (N−1) bar mirrors are disposed on the other side of the stage 110, in which those bar mirrors are arranged as shown in FIG. 3, the goal of the present invention can be reached.

Figure 6:
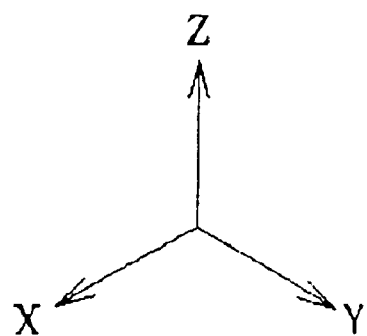
FIG. 6 is a schematic diagram of a position measuring system according to a third embodiment of the present invention.
Figure 6:
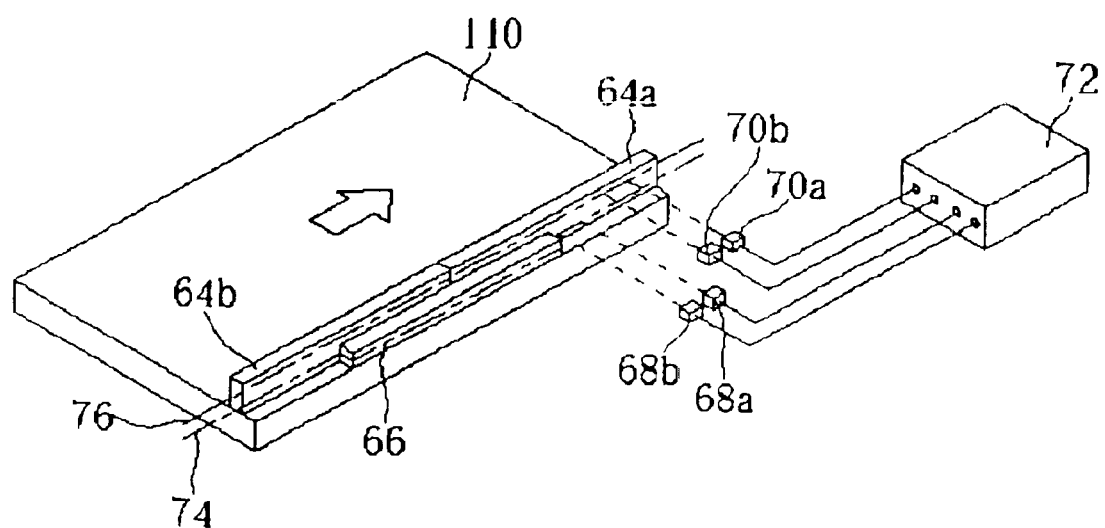

Please refer to FIG. 6. FIG. 6 is a schematic diagram of a position measuring system according to a third embodiment of the present invention. As shown in FIG. 6, a position measuring system comprises the stags 110, bar mirrors 64a, 64b, and 66 disposed on one side of the stage 110, position measuring devices 68a, 68b, 70a, and 70b disposed on the pedestal beside the bar mirror 64a, and a control device 72. In addition, the position measuring system further comprises a driving device (such as a linear motor). The bar mirrors 64a and 64b are positioned at the same horizontal line, and the bar mirror 66 is positioned beside the bar mirrors 64a, 64b. Additionally, a height of the bar mirror 66 is lover than a height of any of the bar mirrors 64a and 64b. The position measuring devices 68a and 68b are positioned on a first horizontal line 74, which passes the bar mirrors 64a, 64b, and 66. In addition, the position measuring devices 70a and 70b are positioned on a second horizontal line 76, which passes the bar mirrors 64a and 64b.

Figure 7A:
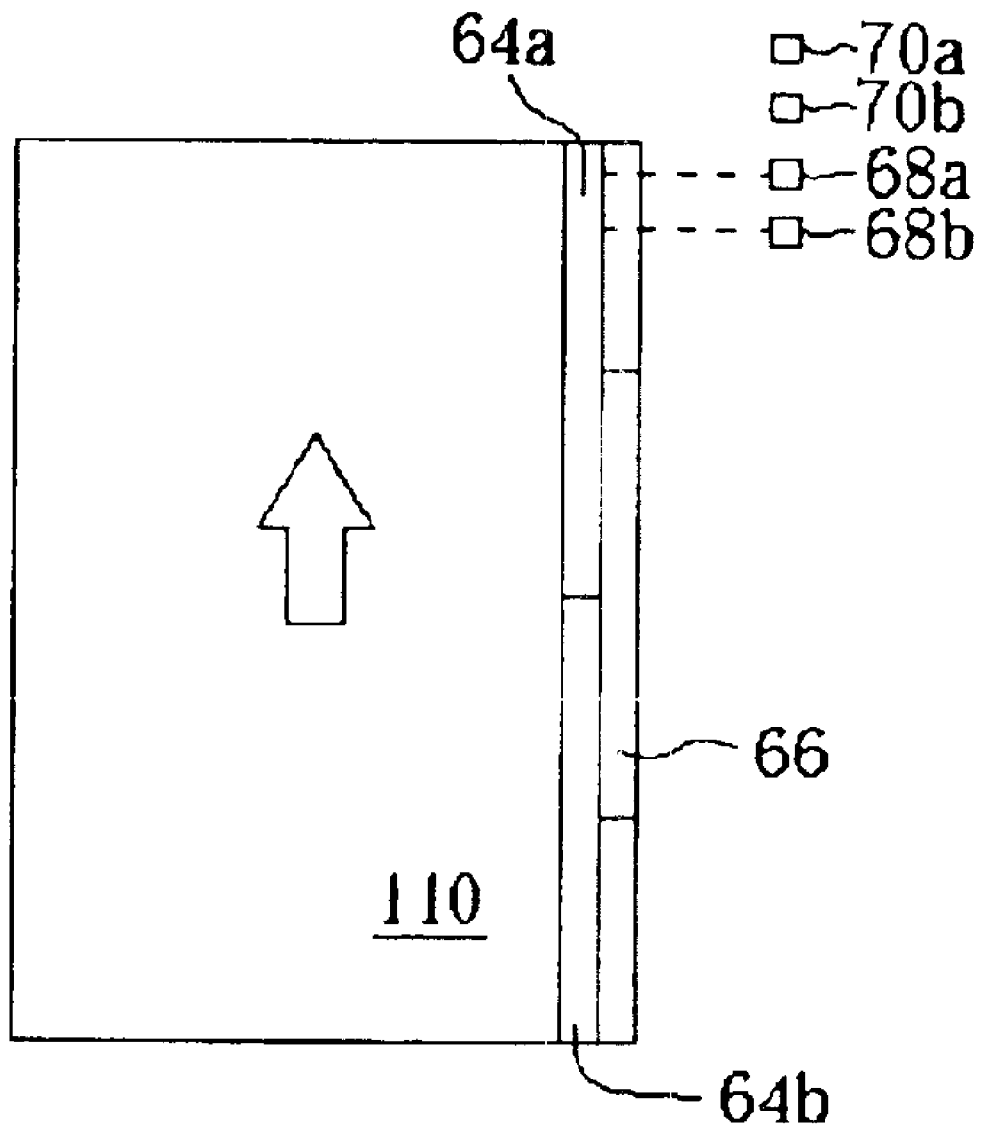
FIG. 7(A) to FIG. 7(D) are schematic diagrams illustrating for measuring a position of the stage as the stage is moved along the X-axis direction.

Please refer to FIG. 7(A) to FIG. 7(D). FIG. 7(A) to FIG. 7(D) are schematic diagrams illustrating measuring a position of the stage as the stage is moved along the X-axis direction. As shown in FIG. 7(A), when the stage 110 is moved along the X-axis direction, the position measuring devices 68a and 68b project laser beams to the bar mirror 64a. Then, the laser beams are reflected by the bar mirror 64a, and are received by the position measuring devices 68a and 68b. After that, a signal processing system processes the projected laser beams and the reflected laser beams to obtain a position of the stage 110 in the Y-axis direction. Thereafter, according the position of the stage 110 calculated by the signal processing system, the control device 72 can utilize the driving device to control the moving direction of the stage 110.

Figure 7B:
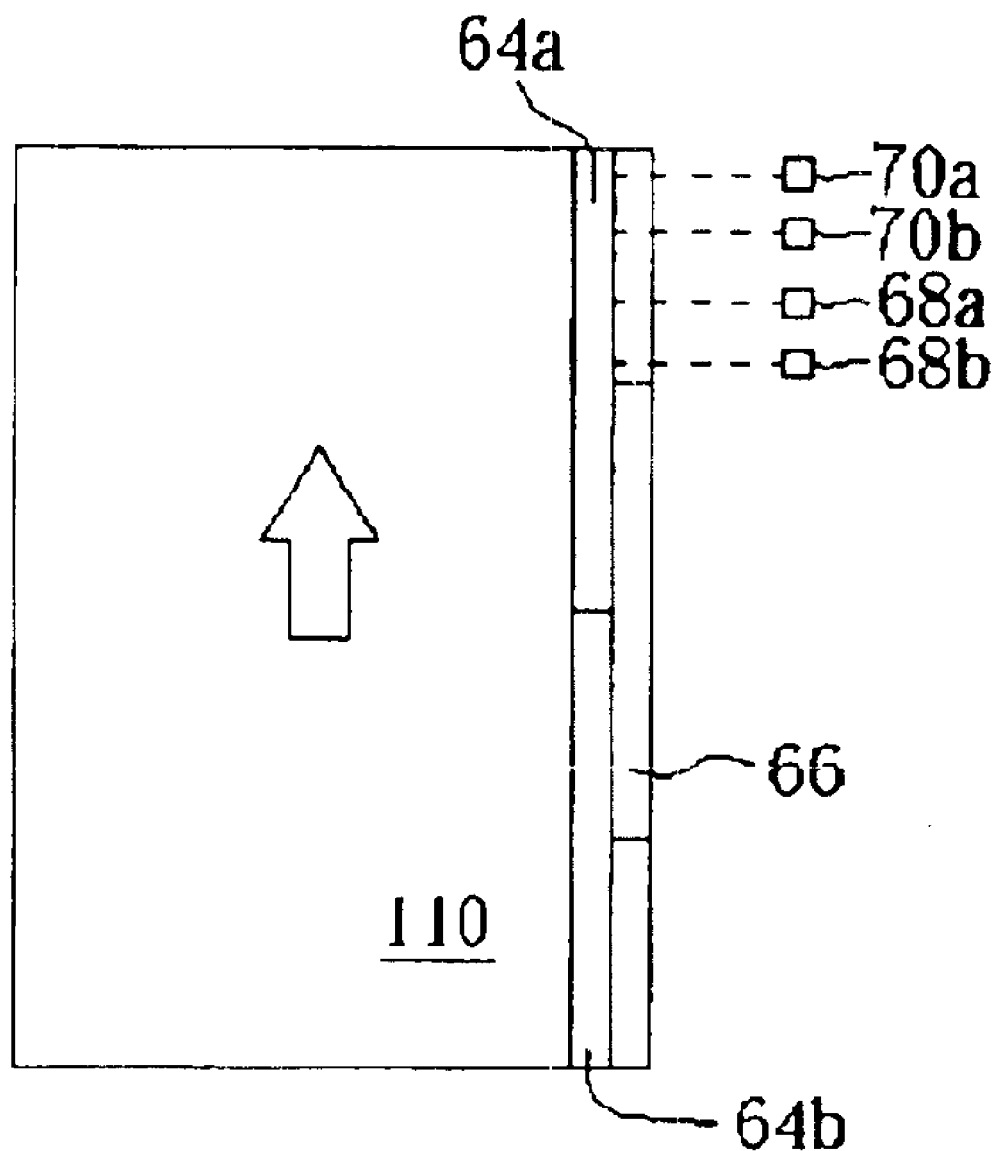
Figure 7C:
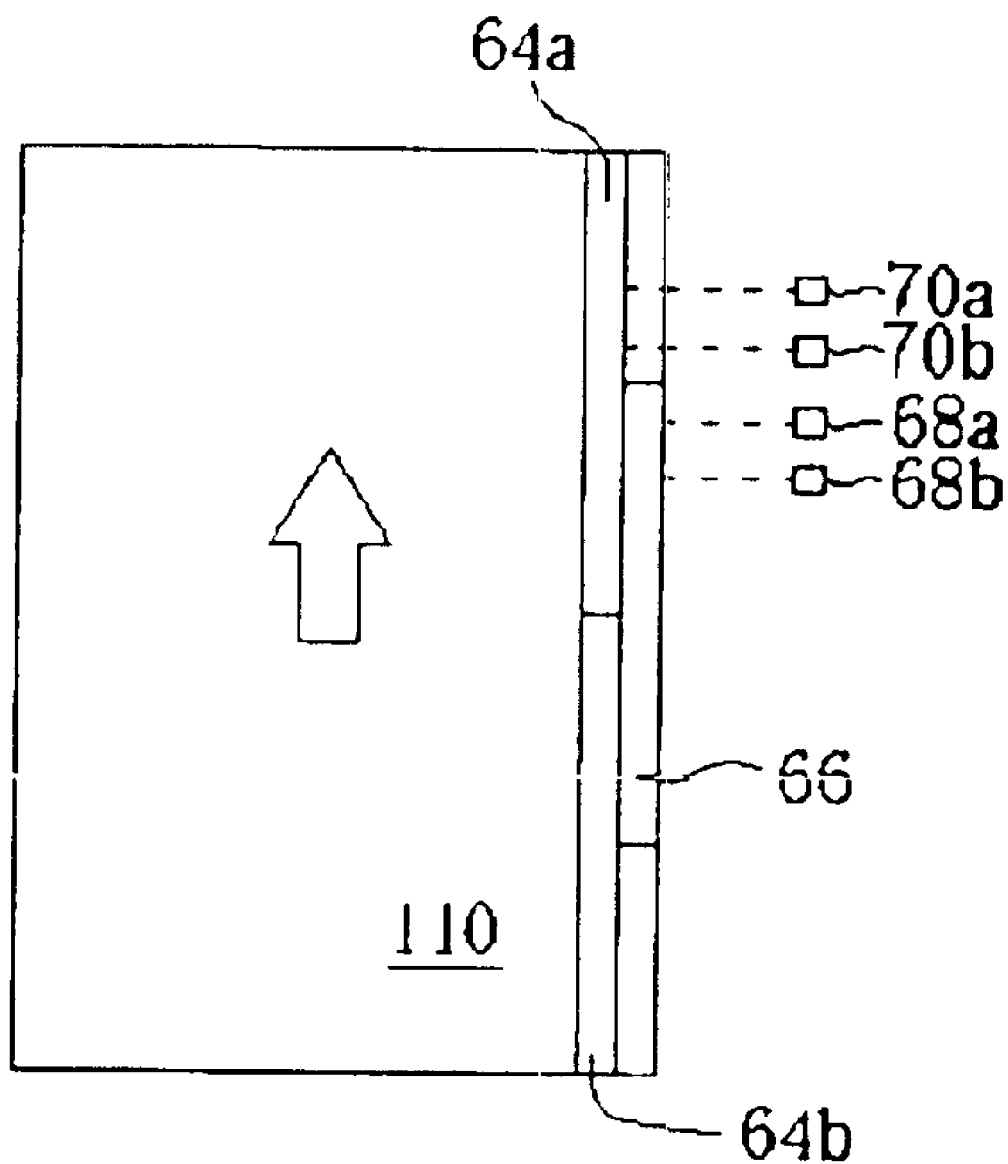
Figure 7D:
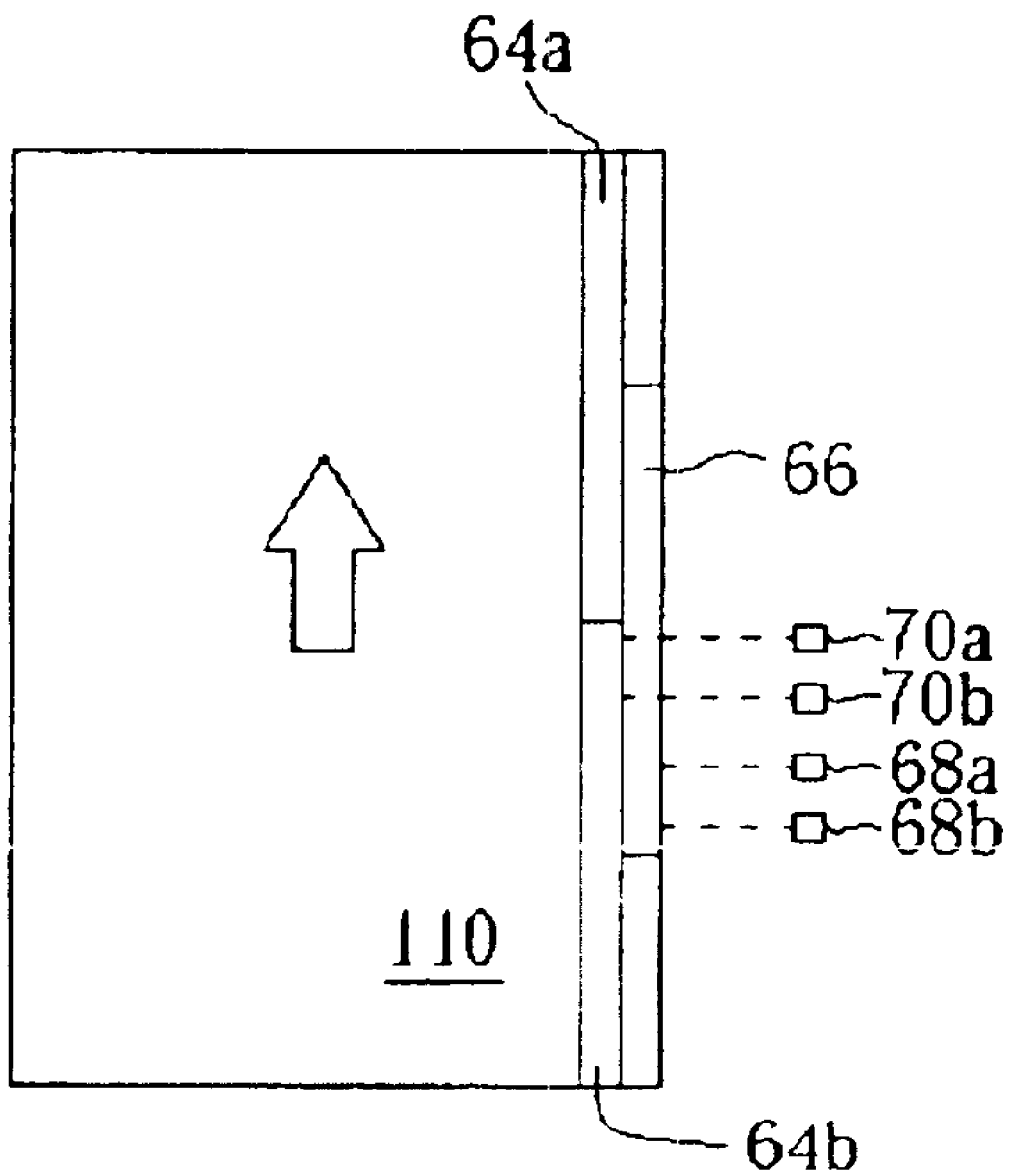

As shown in FIG. 7(B), the stage 110 is continuously moved along the X-axis direction, and when the position measuring devices 70a and 70b pass by the bar mirror 64a, the position measuring devices 70a and 70b begin to measure the position of the stage 110 in the Y-axis direction. Simultaneously, the control device 72 utilizes the results measured by the position measuring devices 68a, 68b to adjust the results measured by the position measuring devices 70a, 70b. After adjusting the position measuring devices 70a and 70b, the control device 72 uses the position measuring devices 70a and 70b to measure the position of the stage 110. Thereafter, as shown in FIG. 7(C), the stage 110 is continuously moved along the X-axis direction, and when the position measuring devices 68a and 68b pass by the bar mirror 66, the control device 72 utilizes the results measured by the position measuring devices 70a, 70b to adjust the results measured by the position measuring devices 68a, 68b. After adjusting the position measuring devices 68a and 68b, the control device 72 uses the position measuring devices 68a, 68b to measure the position of the stage 110. As shown in FIG. 7(D), the stage 110 is continuously moved along the X-axis direction, and when the position measuring devices 70a and 70b pass by the bar mirror 64b, the position measuring devices 70a and 70b begin to measure the position of the stage 110 in the Y-axis direction. Simultaneously, the control device 72 utilizes the results measured by the position measuring devices 68a 68b to adjust the results measured by the position measuring devices 70a, 70b. After adjusting the position measuring devices 70a and 70b, the control device 72 uses the position measuring devices 70a and 70b to measure the position of the stage 110.

Noticeably, in the position measuring system of FIG. 6, if the rotation of the stage 110 is not considered, the position measuring devices 68b and 70b can be omitted.

Figure 8:
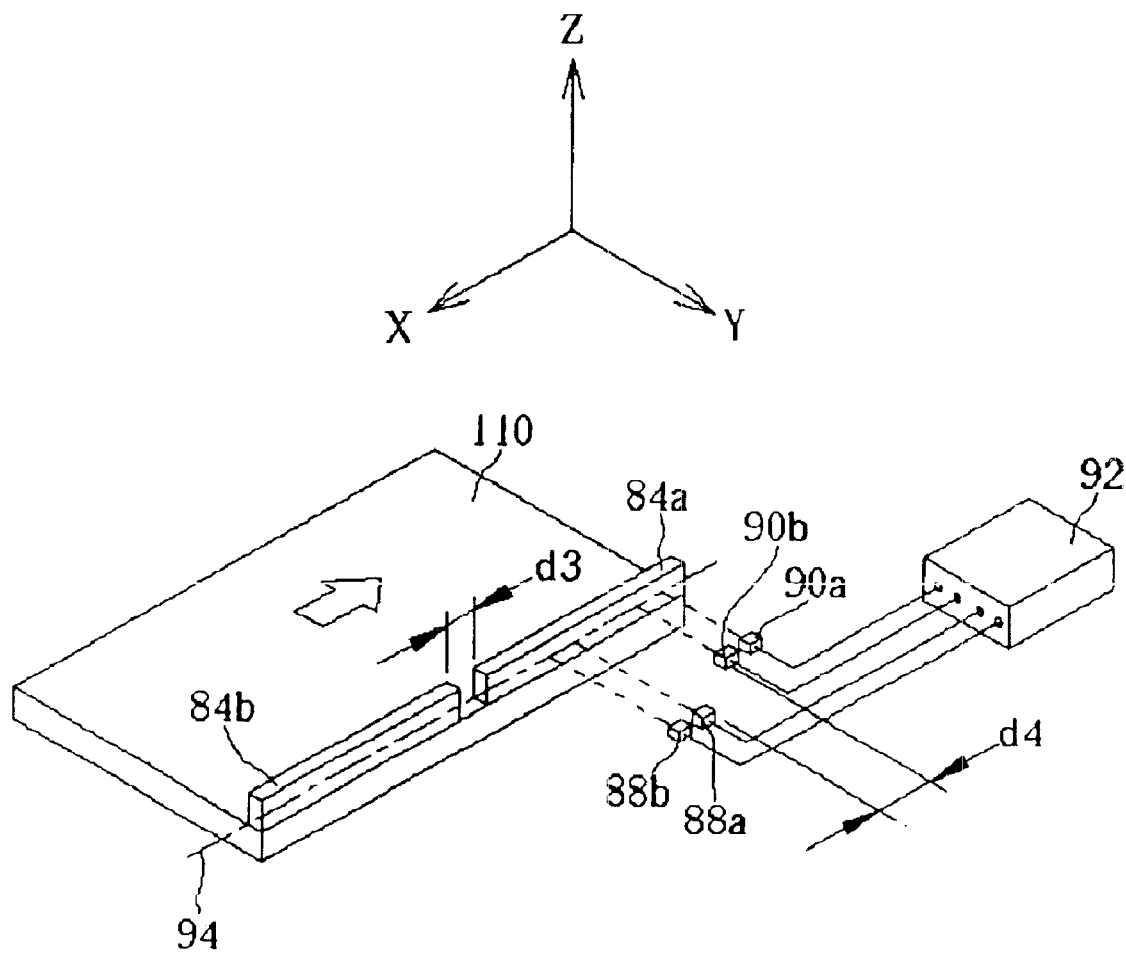
FIG. 8 is a schematic diagram of a position measuring system according to a fourth embodiment of the present invention.

Please refer to FIG. 8. FIG. 8 is a schematic diagram of a position measuring system according to a fourth embodiment of the present invention. As shown in FIG. 8, a position measuring system comprises the stage 110, bar mirrors 84a and 84b disposed on one side of the stage 110, position measuring devices of 88a, 88b, 90a, and 90b disposed on the pedestal beside the bar mirror 84a, and a control device 92. The position measuring system further comprises a driving device (such as a linear motor). The position measuring devices 88a and 88b are positioned on a horizontal line 94. Moreover, the bar mirrors 84a and 84b are positioned at the same horizontal line, and a distance, $d_3$, between the bar mirrors 84a, 84b is smaller than a distance, $d_4$, between the devices position measuring devices 88a, 90b.

Figure 9A:
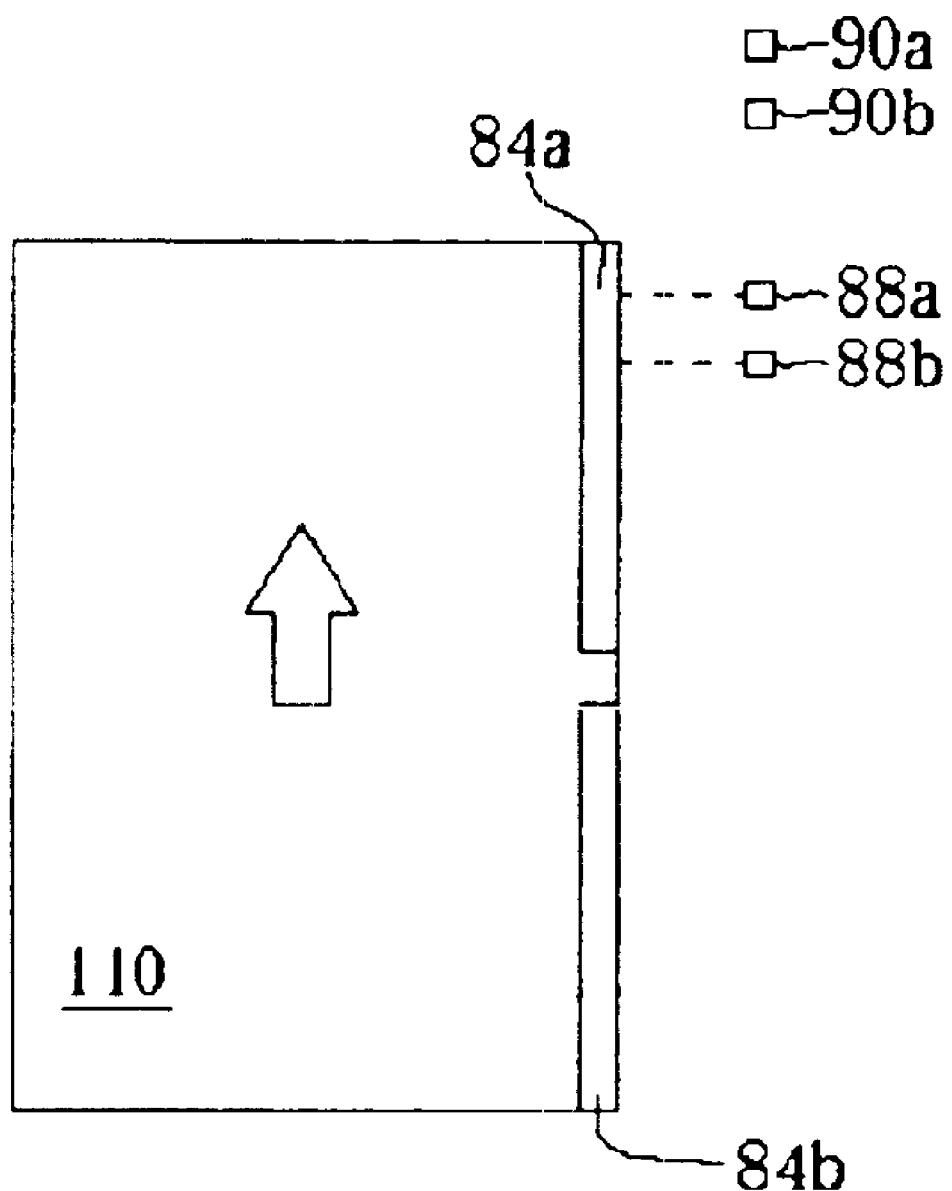
FIG. 9(A) to FIG. 9(C) are schematic diagrams illustrating measuring a position of the stage as the stage is moved along the X-axis direction.
Figure 9B:
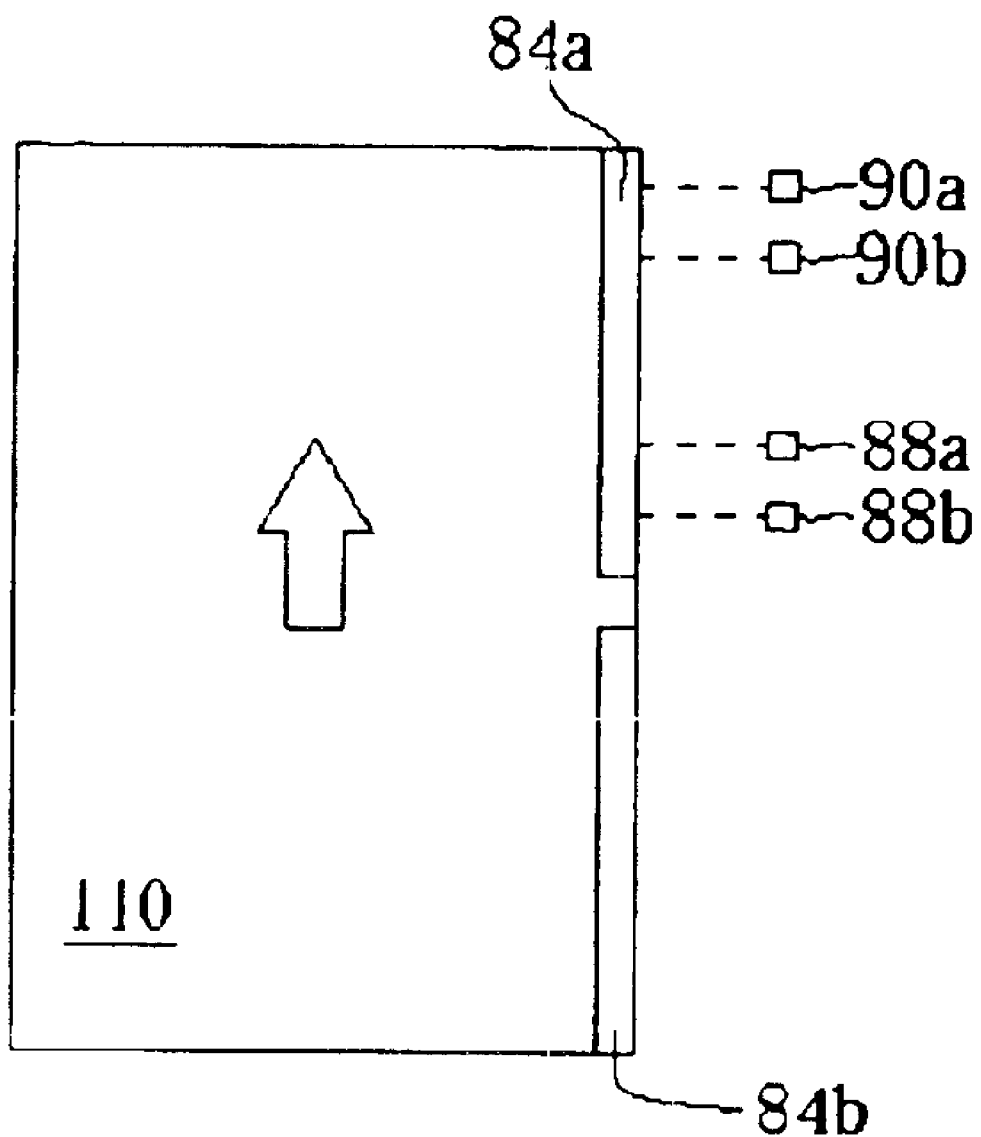
Figure 9C:
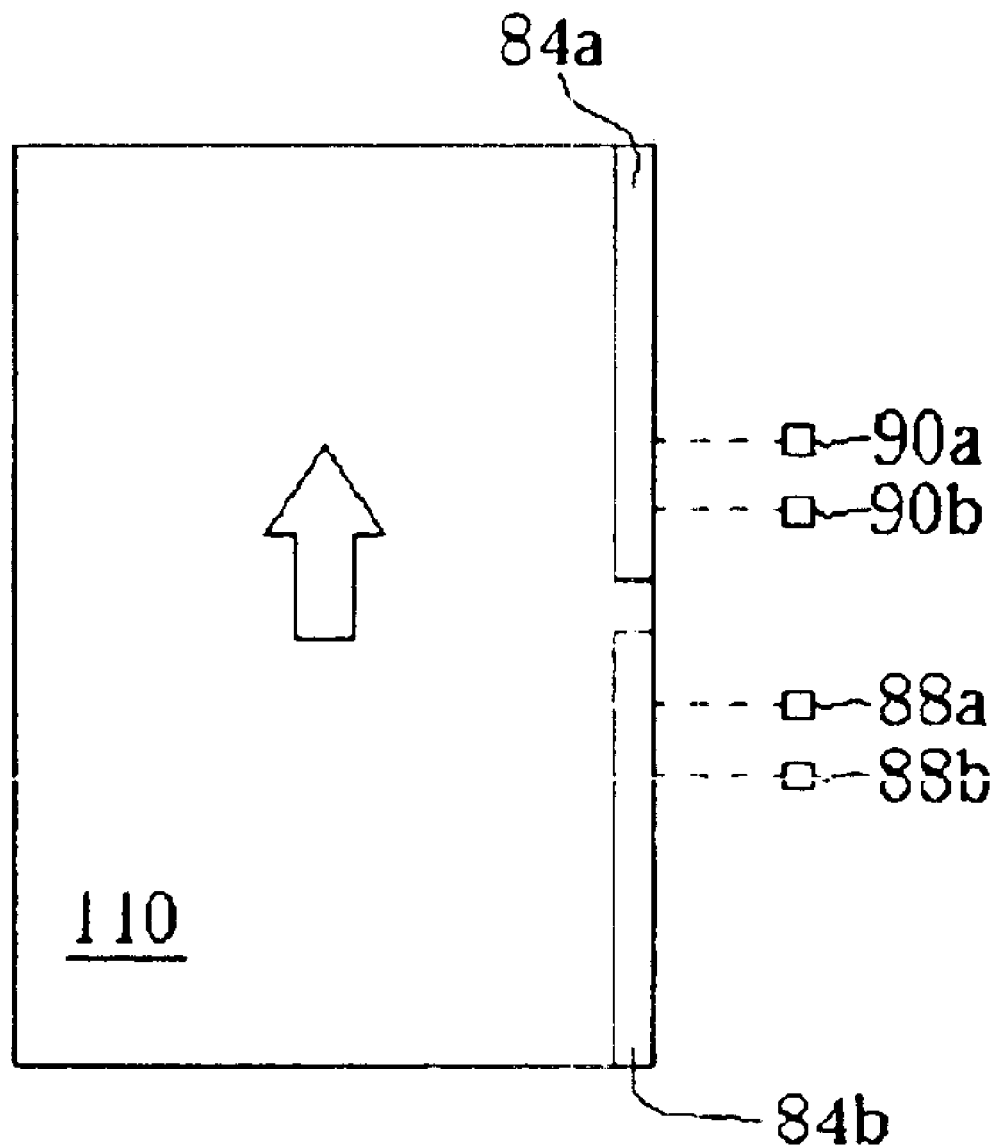

Please refer to FIG. 9(A) to FIG. 9(C). FIG. 9(A) to FIG. 9(C) are schematic diagrams illustrating measuring a position of the stage as the stage is moved along the X-axis direction. As shown in FIG. 9(A), when the stage 110 is moved along the X-axis direction, the position measuring devices 88a and 88b project laser beams to the bar mirror 84a. Then, the laser beams are reflected by the bar mirror 84a, and are received by the position measuring devices 88a and 88b. After that, a signal processing system processes the projected laser beams and the reflected laser beams to obtain a position of the stage 110 in the Y-axis direction. Thereafter, according to the position of the stage 110 calculated by the signal processing system, the control device 92 utilizes the driving device to control the moving direction of the stage 110.

As shown in FIG. 9(B), the stage 110 is continuously moved along the X-axis direction, and when the position measuring devices 90a and 90b pass by the bar mirror 84a, the position measuring devices 90a and 90b begin to measure the position of the stage 110 in the Y-axis direction. Simultaneously, the control device 92 utilizes the results measured by the position measuring devices 88a, 88b to adjust the results measured by the position measuring devices 90a, 90b. After adjusting the position measuring devices 90a and 90b, the control device 92 uses the position measuring devices 90a and 90b to measure the position of the stage 110. Thereafter, as shown in FIG. 9(C), the stage 110 is continuously moved along the X-axis direction, and when the position measuring devices 88a and 88b pass by the bar mirror 84b, the control device 92 utilizes the results measured by the position measuring devices 90a, 90b to adjust the results measured by the position measuring devices 88a, 88b. After adjusting the position measuring devices 88a and 88b, the control device 92 uses the position measuring devices 88a and 88b to measure the position of the stage 110. Noticeably, a distance $d_3$ between the bar mirrors 84a and 84b has to be smaller than a distance $d_4$ between the position measuring devices 88a and 90b. As a result, the position measuring devices 88a, 88b, 90a, and 90b are prevented from being located within a gap between the bar mirrors 84a and 84b, and thus, the position measuring devices 88a, 88b, 90a, and 90b can be used to measure the position of the stage 110 continuously.

Furthermore, in the second, third, and fourth embodiments of the present invention, the position of the bar mirrors and the position of the position measuring devices can be swapped. That is, the position measuring devices can be mounted on the sides of the stage 110, while the bar mirrors are mounted on the pedestal.

Figure 10:
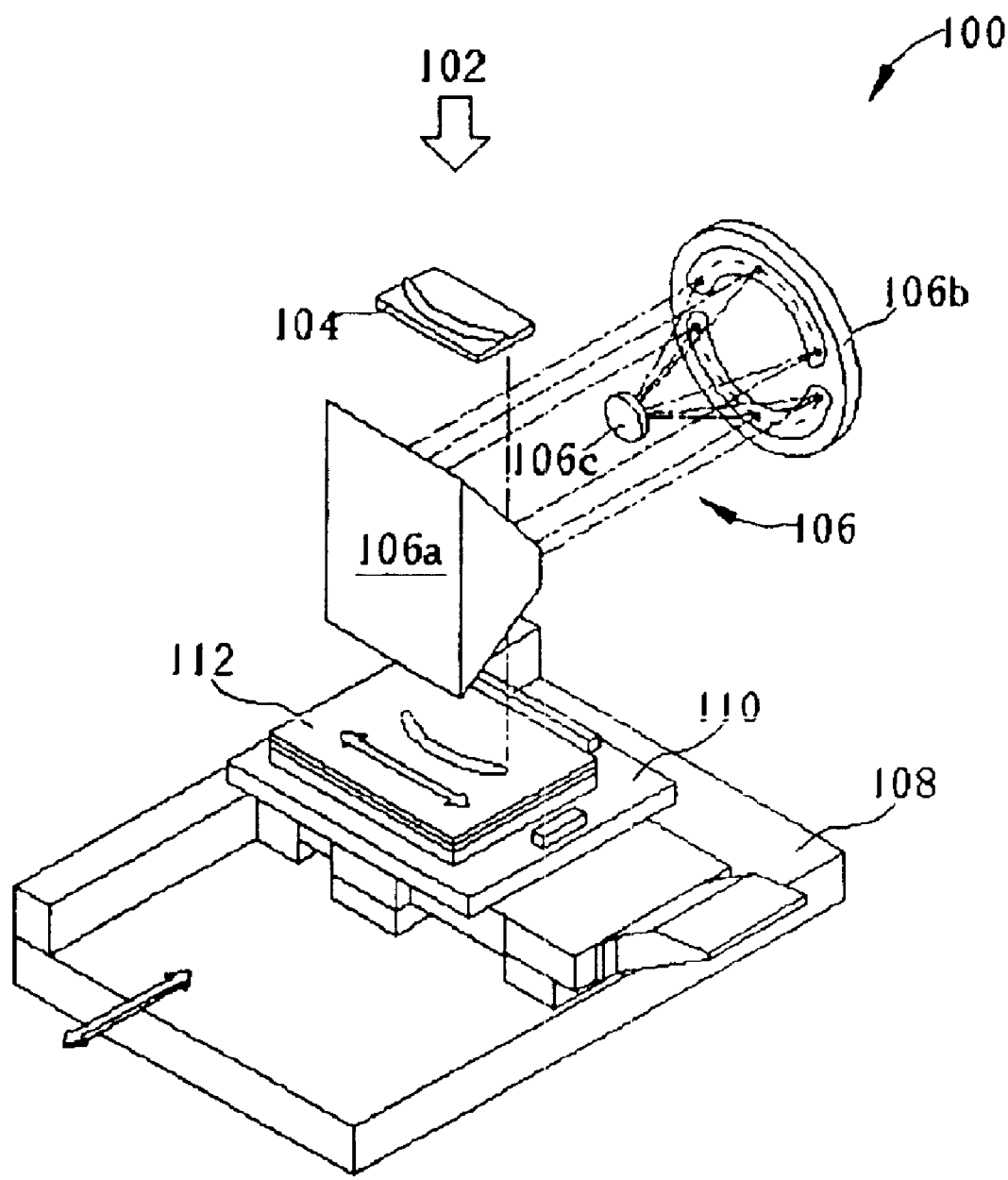
FIG. 10 is a schematic diagram of a prior art scanning exposure system.
Figure 11:
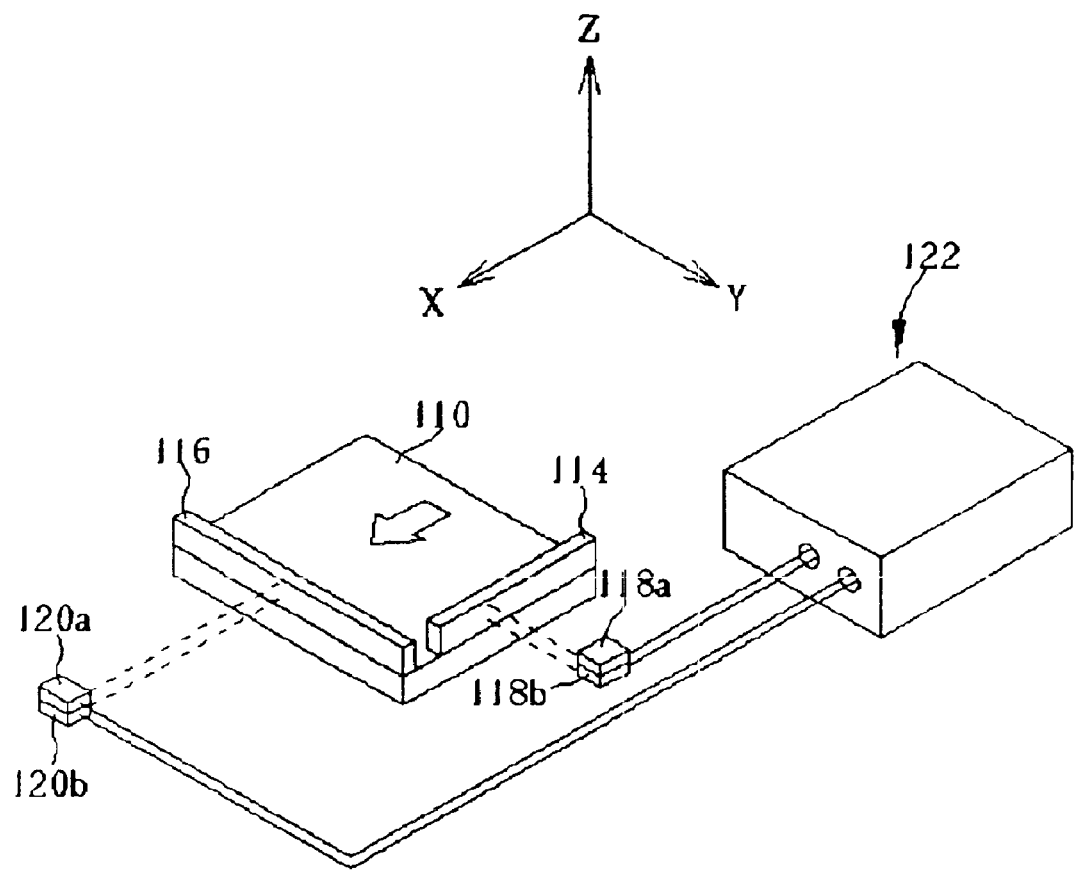
FIG. 11 is a schematic diagram of a prior art position measuring system.

Furthermore, the position measuring system of the present invention can be used to measure the position of the stage 110 in the X-axis direction as the stage 110 is moved along the Y-axis direction, which is known to those skilled in the art. Moreover, the position measuring system of the present invention can be used to measure the position of the mask 104, shown in FIG. 10, in the Y-axis direction as the mask 104 is moved along the X-axis direction. Similarly, the position measuring system of the present invention can be used to measure the position of the mask 104 in the X-axis direction as the mask 104 is moved along the Y-axis direction.

Compared to the prior art, the present invention utilizes a composition of a plurality of bar mirror, and position measuring devices for measuring a position of the stage. Additionally, the amounts of the bar mirror, can be increased or decreased according to the size of the stage, and the position of the stage is measured by adjusting the position measuring device with one another. As a result, the present invention is suitable for use with any kind or size of substrate. Even if the substrate has a large size, the lengths of the bar mirrors are unnecessarily extended, the preventing difficulties in making large-sized bar mirrors.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A position measuring system comprising:
a pedestal;
a stage mounted on the pedestal in a movable way;
a driving device for moving the stage;
a first bar mirror and at least two first position measuring devices for measuring a position of the stage;
a second bar mirror and at least two second position measuring devices for measuring the position of the stage, the first bar mirror and the second bar mirror being disposed in substantially parallel with each other; and
a controlling device for controlling the position measuring system;
wherein when the stage is moved along a specific direction, the controlling device utilizes the first bar mirror and the first position measuring devices to measure the position of the stage during a first period, and utilizes the second bar mirror and the second position measuring devices to measure the position of the stage during a second period partially overlapping with the first period, and utilizes the position measured by the first bar mirror and the first position measuring devices to adjust the position measured by the second bar mirror and the second position measuring devices during an overlapping period of the first period and the second period.

2. The position measuring system of claim 1 wherein the first bar mirror and the second bar mirror are disposed on the stage.

3. The position measuring system of claim 2 wherein the first bar mirror and the second bar mirror are respectively disposed on the opposite sides of the stage, parallel to the specific direction along which the stage is moved.

4. The position measuring system of claim 3 wherein the first bar mirror and the second bar mirror are both disposed on the same side of the stage, parallel to the specific direction along which the stage is moved.

5. The position measuring system of claim 1 wherein the first bar mirror and the second bar mirror are disposed on the pedestal.

6. The position measuring system of claim 5 wherein the first bar mirror and the second bar mirror are respectively disposed on opposite sides of the pedestal, parallel to the specific direction along which the stage is moved.

7. The position measuring system of claim 5 wherein the first bar mirror and the second bar mirror are both disposed on the same side of the pedestal, parallel to the specific direction along which the stage is moved.

8. The position measuring system of claim 1 wherein the stage is horizontally moved on a horizontal plane of the pedestal, and the first position measuring devices measure a distance between the first bar mirror and the first position measuring devices along a first horizontal line of the first and the second bar mirrors while the second position measuring devices measure a distance between the second bar mirror and the second position measuring devices along a second horizontal line of the first and the second bar mirrors, and the first horizontal line and the second horizontal line are located at different heights.

9. A position measuring system comprising:

a stage mounted on a pedestal in a movable way;

at least a first bar mirror and a second bar mirror having a gap therebetween, the first and the second bar mirrors being disposed on the same side of the stage and substantially parallel with each other;

a first end a second position measuring devices disposed on the pedestal; and a controlling device for controlling the position measuring system;

wherein when the stage is moved along a specific direction, the controlling device utilizes the first bar mirror, the first position measuring device, and the second position measuring device for measuring a position of the stage, and after the first position measuring device passes the gap, the controlling device utilizes the position measured by the second position measuring device to adjust the position measured by the first position measuring device, and then the controlling device utilizes the first bar mirror, the second bar mirror, the first position measuring device, and the second position measuring device for measuring the position of the stage.

10. The position measuring system of claim 9 wherein the first bar mirror and the second bar mirror are parallel to the specific direction along which the stage is moved.

11. The position measuring system of claim 9 wherein a distance between the first and second position measuring devices is larger than a distance of the gap between the first bar mirror and the second bar mirror.

12. The position measuring system of claim 9 wherein a distance between the first position measuring device and the second position measuring device is smaller than a length of each of the first bar mirror and the second bar mirror.

13. The position measuring system of claim 9 wherein when the first position measuring device is about to pass the gap, the position of the stage is determined by the first bar mirror and the second position measuring device.

14. A position measuring system comprising:

a stage mounted on a pedestal in a movable way;

at least a first bar mirror and a second bar mirror having a gap therebetween, the first and the second bar mirrors being disposed in substantially parallel with each other; and a first and a second position measuring devices disposed on the pedestal;

wherein when the stage is moved along a specific direction, the first bar mirror, the first position measuring device, and the second position measuring device are utilized for measuring a position of the stage, and after the first position measuring device passes the gap, the position measured by the second position measuring device is utilized to adjust the position measured by the first position measuring device, and then, at least the first position measuring device and the second bar mirror are utilized for measuring the position of the stage, and after the second position measuring device passes the gap, the second bar mirror, the first position measuring device, and the second position measuring device are utilized for measuring the position of the stage.

15. The position measuring system of claim 14 wherein the first bar mirror and the second bar mirror are substantially parallel to the specific direction along which the stage is moved.

16. The position measuring system of claim 14 wherein a distance between the first and second position measuring devices is larger than a distance of the gap between the first bar mirror and the second bar mirror.

17. The position measuring system of claim 14 wherein a distance between the first position measuring device and the second position measuring device is smaller than a length of each of the first bar mirror and the second bar mirror.

18. The position measuring system of claim 14 wherein when the first position measuring device is about to pass the gap, the position of the stage is determined by the first bar mirror and the second position measuring device.

* * * * *